United States Patent [19]

Mori et al.

[11] Patent Number: 5,705,408
[45] Date of Patent: Jan. 6, 1998

[54] METHOD FOR FORMING SEMICONDUCTOR INTEGRATED CIRCUIT USING MONOLAYER EPITAXIAL GROWTH

[75] Inventors: Toshihiko Mori; Yoshiaki Nakata, both of Kawasaki, Japan

[73] Assignee: Fujitsu Limited, Kanagawa, Japan

[21] Appl. No.: 720,175

[22] Filed: Sep. 25, 1996

[30] Foreign Application Priority Data

Apr. 19, 1996 [JP] Japan ................................. 8-098734

[51] Int. Cl.$^6$ ................................................ H01L 21/265
[52] U.S. Cl. ........................... 437/31; 437/108; 437/112; 437/128; 148/DIG. 41; 148/DIG. 169
[58] Field of Search ........................ 437/31, 108, 112, 437/128; 148/DIG. 169, DIG. 41

[56] References Cited

U.S. PATENT DOCUMENTS

| | | | |
|---|---|---|---|
| 5,049,951 | 9/1991 | Goronkin et al. | 357/4 |
| 5,311,465 | 5/1994 | Mori et al. | 365/179 |
| 5,361,720 | 11/1994 | Evetts et al. | 505/329 |

Primary Examiner—John Niebling
Assistant Examiner—Long Pham
Attorney, Agent, or Firm—Armstrong, Westerman, Hattori, McLeland & Naughton

[57] ABSTRACT

A semiconductor integrated circuit device including: an off-substrate having a semiconductor surface with a plurality of steps each having a height of one monolayer and extending in one direction; a wiring layer formed on the semiconductor surface of the off-substrate and made of semiconductor material, the wiring layer including a plurality of conductive stripe regions and high resistance strip regions disposed in a stripe pattern, each stripe region extending in a direction parallel with the steps, and the conductive stripe regions and the high resistance stripe regions both having lattice structures identical to those of underlying surfaces; and semiconductor elements formed on the wiring layer and electrically connected to the conductive stripe regions, the semiconductor elements including semiconductor regions with lattice structures identical to those of the conductive stripe regions. Technologies of manufacturing a semiconductor element on a semiconductor substrate capable of reducing the number of fine pattern fabrication processes by photolithography or capable of dispensing with these processes.

8 Claims, 7 Drawing Sheets

METHOD FOR FORMING SEMICONDUCTOR INTEGRATED CIRCUIT USING MONOLAYER EPITAXIAL GROWTH

BACKGROUND OF THE INVENTION a) Field of the Invention

The present invention relates to a semiconductor integrated circuit and a method of manufacturing a semiconductor device.

b) Description of the Related Art

A conventional semiconductor integrated circuit has been manufactured by depositing a semiconductor layer or insulating layer generally uniformly over the whole region of a semiconductor substrate and patterning it by photolithography.

It is difficult for photolithography techniques to pattern a semiconductor layer or insulating layer in a size of 100 nm or smaller. Damages, contamination, or the like may be generated during a patterning process.

SUMMARY OF THE INVENTION

It is an object of the present invention to provide technologies for manufacturing a semiconductor element on a semiconductor substrate capable of reducing the number of fine pattern fabrication processes by photolithography or capable of dispensing with these processes.

According to one aspect of the present invention, there is provided a semiconductor integrated circuit device comprising: an off-substrate having a semiconductor surface with a plurality of steps each having a height of one monolayer and extending in one direction; a wiring layer formed on the semiconductor surface of the off-substrate and made of semiconductor material, the wiring layer including a plurality of conductive stripe regions and high resistance strip regions disposed in a stripe pattern, each stripe region extending in a direction parallel with the steps, and the conductive stripe regions and the high resistance stripe regions both having lattice structures identical to those of underlying surfaces; and semiconductor elements formed on the wiring layer and electrically connected to the conductive stripe regions, the semiconductor elements including semiconductor regions with lattice structures identical to those of the conductive stripe regions.

The high resistance stripe region isolates each conductive stripe region. The conductive stripe region can be used as wiring disposed in a stripe pattern.

According to another aspect of the present invention, there is provided a method of manufacturing a semiconductor device comprising the steps of: preparing an off-substrate having a semiconductor surface with a plurality of steps each having a height of one monolayer and extending in one direction; and laminating a plurality of semiconductor layers of a plurality of monolayers by repeating, a process of depositing a semiconductor layer of one monolayer while semiconductor source material is supplied to the semiconductor surface of the off-substrate and while the composition of the source material is changed at least once during the period from a start of deposition of the semiconductor layer to the end of deposition of the semiconductor layer of one monolayer, a plurality of times while the same composition change sequence of the source material is used.

As the semiconductor source material is supplied to the semiconductor surface with steps, one point of each step functions as the growth nucleus and atoms are deposited along the step. A monolayer is deposited over the whole substrate surface while the position of the step moves in the substrate in-plane. This operation is repeated to form a semiconductor layer made of a plurality of monolayers. If the composition of the source material is changed during the period while the monolayer is deposited, a semiconductor layer can be formed having a plurality of regions the compositions of which are different from each other and which are disposed in the direction perpendicular to the step in the substrate in-plane.

According to a further aspect of the present invention, there is provided a semiconductor integrated circuit device comprising: an off-substrate having a semiconductor surface with a plurality of steps each having a height of one monolayer and extending in a first direction and with a plurality of kinks formed at cross points between each step and a plurality of virtual straight lines extending in a second direction intersecting with the first direction; a first wiring layer made of semiconductor material and formed on the semiconductor surface of the off-substrate, the first wiring layer having a plurality of conductive stripe regions and high resistance stripe regions disposed in a stripe pattern, each stripe extending in the first direction, and both the conductive stripe regions and the high resistance stripe regions having lattice structures identical to those of the underlying surfaces; a second wiring layer made of semiconductor material and formed over the semiconductor surface of the off-substrate, the second wiring layer having a plurality of conductive stripe regions and high resistance stripe regions disposed in a stripe pattern, each stripe extending in the second direction, and both the conductive stripe regions and the high resistance stripe regions having lattice structures identical to those of the underlying surfaces; a plurality of semiconductor elements formed between the first and second wiring layers and at cross points between the conductive stripe regions of the first and second wiring layers, the plurality of semiconductor elements being electrically connected to corresponding ones of the conductive stripe regions of the first and second wiring layers; and element separation regions formed between the first and second wiring layers, each of the element separation regions being formed between two adjacent semiconductor elements and made of high resistance semiconductor material, the element separation regions having lattice structures identical to those of the underlying surface and the semiconductor regions constituting each semiconductor element.

In the first and second wiring layers, the high resistance stripe region isolates each conductive stripe region. The conductive stripe regions function as the wiring patterns disposed in a lattice shape. A semiconductor element is disposed at each lattice point, and isolated by the element separation region.

According to a still further aspect of the present invention, there is provided a method of manufacturing a semiconductor device comprising the steps of: preparing an off-substrate having a semiconductor surface with a plurality of steps each having a height of one monolayer and extending in a first direction and with a plurality of kinks formed at cross points between each step and a plurality of virtual straight lines extending in a second direction intersecting with the first direction; supplying semiconductor source material to the semiconductor surface of the off-substrate and depositing atoms of the semiconductor source material along the each step from each kink to a next kink by using the kink as the growth nucleus, a train of the atoms being deposited by changing the composition of the semiconductor source material at least once during the deposition; and repeating the atom train depositing step by a plurality of times while the composition change sequence of the source material is maintained constant to thereby form a monolayer stripe region extending in the first direction and changing the composition in the first direction.

If the composition of the source material is changed during the process of depositing atoms of the source material from a kink to the next kink along the step, regions having different compositions from each other can be disposed in the direction parallel with the step.

The method may further comprise the steps of: repeating the monolayer stripe region forming step a plurality of times while the composition change sequence of the source material is changed to thereby deposit a monolayer semiconductor layer on the whole surface; and repeating the monolayer semiconductor layer depositing step a plurality of times while the composition change sequence of the source material is set to the same sequence as that used when the underlying monolayer semiconductor layer is deposited, to thereby form a composition changing layer changing the composition in the substrate in-plane.

By repeating the monolayer stripe region forming step a plurality of times while the composition change sequence of the source material is changed, regions having different compositions from each other can be disposed in the direction intersecting with the step. Namely, semiconductor regions having desired compositions capable of being epitaxially grown can be disposed at desired positions in the two directions including the direction parallel with the step and the direction perpendicular to the step.

As above, a semiconductor layer is grown one monolayer after another by using one point on a step or a kink as the growth nucleus, and the composition of the source material is changed during the growth. Therefore, it is possible to dispose semiconductor regions having desired compositions capable of being epitaxially grown at desired positions. By periodically disposing a high resistance stripe semiconductor region, element separation and wiring pattern separation can be achieved without performing photolithography and etching.

DETAILED DESCRIPTION OF THE PREFERRED EMBODIMENTS

The principle of growth of a semiconductor layer according to the first embodiment of the invention will be described with reference to FIGS. 1A and 1B.

Figure 1A:
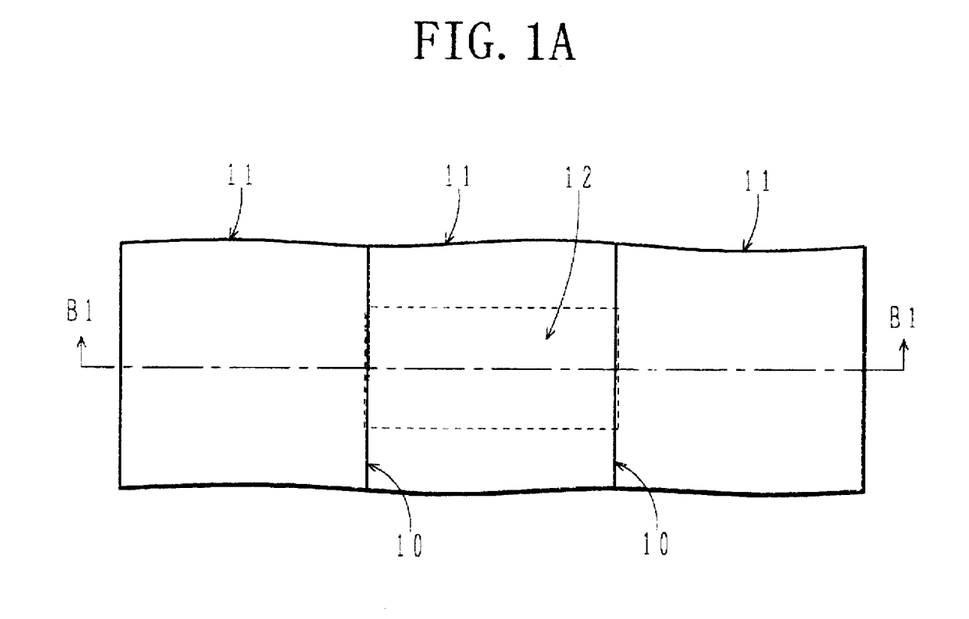
FIGS. 1A and 1B are a plan view and a cross sectional view illustrating the principle of growing a semiconductor layer according to a first embodiment of the invention.

FIG. 1A is a plan view of a GaAs semiconductor substrate having a small off-angle in the [110] direction from the (001) plane. A plurality of steps 10 extend in a vertical direction in FIG. 1A. A terrace 11 with the (001) plane is defined between two adjacent steps.

Figure 1B:
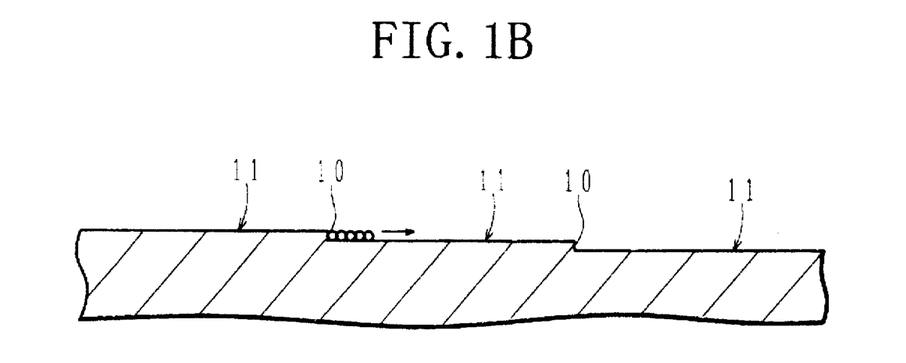

FIG. 1B is a cross sectional view taken along one-dot-chain line B1—B1 of FIG. 1A. On the surface of the substrate, the steps 10 are formed having a height of a monolayer. As semiconductor source material is supplied to the surface of this substrate, atoms of the supplied source material are deposited along the step 10, and the step moves to the right as viewed in FIG. 1B by a distance equal to a thickness of a monolayer. As the source material continues to be supplied, the step further moves by a distance equal to a thickness of a monolayer. This operation is repeated to eventually grow a semiconductor layer made of a monolayer on the whole surface.

A monolayer means a repetition unit of each crystal layer grown at an atomic level. For example, in the case of GaAs, a growth layer means a pair of one Ga site and one As site, and in the case of group IV element semiconductor, a growth layer means a monoatomic layer.

If the composition of the source material is changed while a monolayer is deposited over the whole surface of the substrate, a monolayer can be formed changing its composition in the direction perpendicular to the step 10. One cycle is defined as a period from the start of deposition of a monolayer at the step 10 to when the front end of the grown monolayer reaches the next step. If a plurality of cycles having the same composition change sequence of the source material are executed, a semiconductor layer can be formed having its composition changing in the direction perpendicular to the step 10.

Even if the distances between steps on the substrate surface are not uniform, the distances between steps become generally equal after several scores or hundreds nanometer thick layer is deposited, or after annealing.

Although the substrate shown in FIGS. 1A and 1B exposes the surface tilted from the (0 0 1) plane by a small angle, other substrates may be used. For example, an off-substrate may be used which exposes the surface tilted from the (1 1 0) plane by a small angle in the [0 0 1] direction.

Next, a method of manufacturing a semiconductor device according to the first embodiment of the invention will be described with reference to FIGS. 2A to 2H. FIGS. 2A to 2G show patterns in plan view of a semiconductor layer grown in the rectangular terrace region 12 between adjacent two steps 10 shown in FIG. 1A. FIG. 2H shows a pattern in plan view of grooves formed in the terrace region 12. The substrate used in this embodiment is a GaAs off-substrate having a surface tilted from (0 0 1) plane in the [1 1 0] direction by an angle of 0.2 degree. In this case, the distance between adjacent two steps is about 80 nm.

Figure 2A:
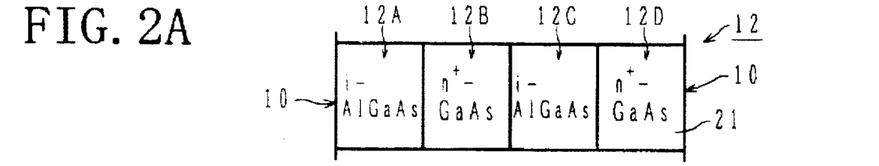
FIGS. 2A to 2H are plan views illustrating a method of manufacturing a semiconductor device according to the first embodiment of the invention.

The right and left sides of the terrace region 12 shown in FIG. 2A correspond to the steps 10 of a GaAs substrate surface. As source material of a semiconductor layer is supplied to the substrate surface, a monolayer is formed from the left to right as viewed in FIG. 2A. When the grown monolayer reaches the step 10 at the right side end, a monolayer grown on another contiguous terrace region on the left side of the terrace region shown in FIG. 2A also reaches the step 10 at the left side shown in FIG. 2A. Therefore, a second monolayer starts again to grow from the step 10 at the left side end toward the right.

Growth of a semiconductor layer is performed, for example, by using a solid source material and molecular beam epitaxy (MBE) under the conditions of a substrate temperature of 690° C., a V/III ratio of 6, and a growth speed of 0.1 μm/h. At this growth speed, a semiconductor layer of one monolayer can grow in about 10.8 seconds. Namely, one cycle is about 10.8 seconds.

First, the composition of the source material is changed every 2.7 seconds during one cycle to sequentially deposit a non-doped AlGaAs layer, an n$^+$-type GaAs layer, a non-doped AlGaAs layer, and an n$^+$-type GaAs layer. The n$^+$-type GaAs layer is an Si doped layer having an impurity concentration of $5 \times 10^{18}$ cm$^{-3}$. The terrace region 12 is divided in the lateral direction to define four sub-regions 12A to 12D. On the leftmost sub-region 12A and third sub-region 12C from the leftmost, the non-doped AlGaAs monolayers are formed and on the second sub-region 12B from the leftmost and the rightmost sub-region 12D, the n$^+$ type GaAs monolayers are formed.

Although the composition of the source material is changed every 2.7 seconds at the above process, the change time interval is not necessary to be the same. If the time interval is changed, the size of each sub-region 12A to 12D becomes different.

The growth of the monolayer is repeated 100 times by using the same composition change sequence of the source material. Semiconductor layers having the same plan pattern as that shown in FIG. 2A are formed also on terrace regions other than the terrace region 12. Therefore, a final word line layer 21 about 30 nm thick has non-doped AlGaAs stripe regions and n$^+$-type type GaAs stripe regions extending in the direction in parallel with the steps 10 and alternately arranged in the direction perpendicular to the steps 10.

In the processes illustrated in FIGS. 2B to 2F, semiconductor layers are sequentially formed by changing the composition change sequence of the source material and the number of repetitions of growing a monolayer, different from those of the process described with FIG. 2A.

Figure 2B:
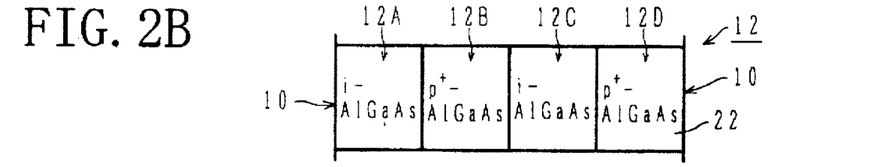

As shown in FIG. 2B, non-doped AlGaAs layers are deposited on the sub-regions 12A and 12C, and Be doped p$^+$-type AlGaAs layers having an impurity concentration of $1 \times 10^{19}$ cm$^{-3}$ are deposited on the sub-regions 12B and 12D. The thicknesses of these semiconductor layers are 50 nm. A final lower emitter layer 22 has non-doped AlGaAs stripe regions and p$^+$-type AlGaAs stripe regions alternately arranged.

Figure 2C:
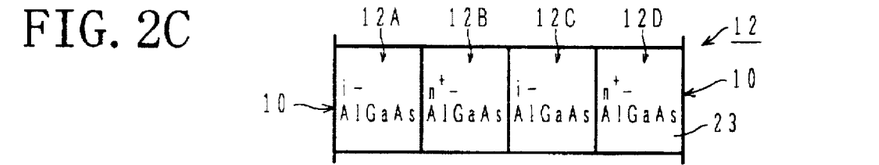

As shown in FIG. 2C, non-doped AlGaAs layers are deposited on the sub-regions 12A and 12C, and Si doped n$^+$-type AlGaAs layers having an impurity concentration of $5 \times 10^{18}$ cm$^{-3}$ are deposited on the sub-regions 12B and 12D. The thicknesses of these semiconductor layers are 50 nm. A final upper emitter layer 23 has non-doped AlGaAs stripe regions and n$^+$-type AlGaAs stripe regions alternately arranged.

Figure 2D:
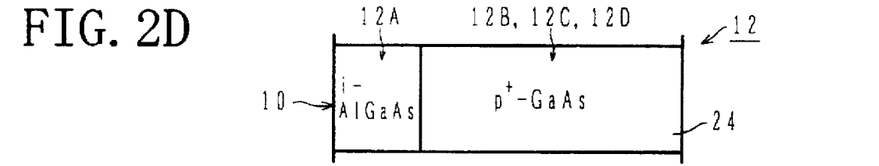

As shown in FIG. 2D, a non-doped AlGaAs layer is deposited on the sub-region 12A, and p$^+$-type GaAs layers having an impurity concentration of $5 \times 10^{19}$ cm$^{-3}$ are deposited on the sub-regions 12B to 12D. The thicknesses of these semiconductor layers are 70 nm. A final base layer 24 has a non-doped AlGaAs stripe region and p$^+$-type GaAs stripe regions alternately arranged, the width of the GaAs stripe region being about a threefold of that of the non-doped AlGaAs stripe region.

Figure 2E:
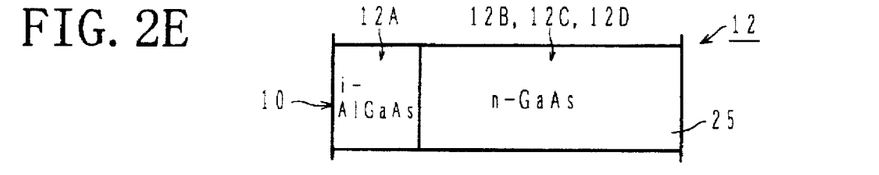

As shown in FIG. 2E, a non-doped AlGaAs layer is deposited on the sub-region 12A, and n-type GaAs layers having an impurity concentration of $1 \times 10^{17}$ cm$^{-3}$ are deposited on the sub-regions 12B to 12D. The thicknesses of these semiconductor layers are 400 nm. A final collector layer 25 has a non-doped AlGaAs stripe region and n-type GaAs stripe regions alternately arranged, the width of the GaAs stripe region being about a threefold of that of the non-doped AlGaAs stripe region.

Figure 2F:
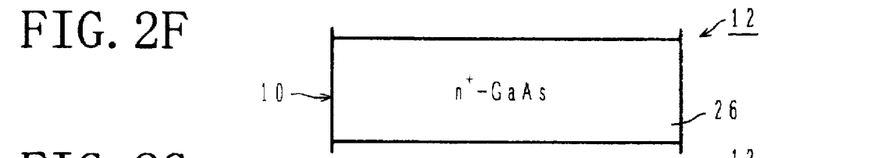

As shown in FIG. 2F, n$^+$-type GaAs layers are deposited over the whole area of the terrace region 12, the layers having a thickness of 400 nm and an impurity concentration of $5 \times 10^{18}$ cm$^{-3}$. An n$^+$-type sub-collector layer 26 is therefore formed on the whole surface.

Figure 2G:
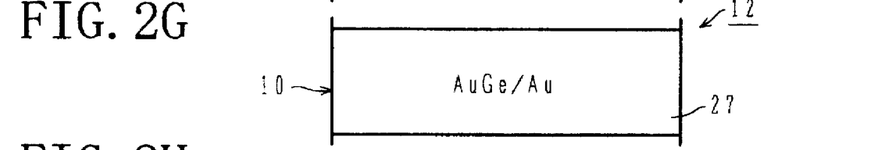
Figure 2H:
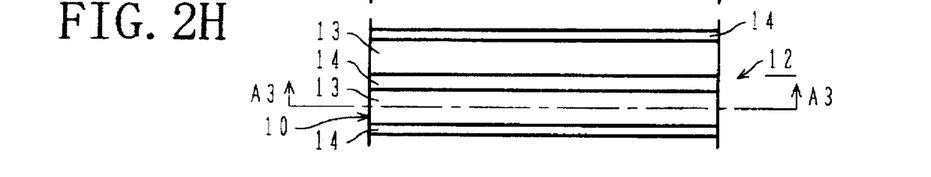

As shown in FIG. 2G, a wiring layer 27 made of two layers of AuGe (lower layer) and Au (upper layer) is formed over the whole substrate surface by vapor deposition.

As shown in FIG. 2H, in the terrace region 12, two stripe resist patterns 13 are formed extending in the lateral direction (direction perpendicular to the step 10). By using the resist patterns 13 as a mask, the layers including the wiring layer 27 formed at the process illustrated in FIG. 2G to the lower emitter layer 22 formed at the process illustrated in FIG. 2B are etched. Etching the AuGe/Au layer is performed, for example, by ion milling using At, and etching the GaAs layers and AlGaAs layers are performed, for example, by RIE using Cl$_2$. The resist patterns 13 are thereafter removed.

With this etching process, a plurality of grooves 14 are formed extending in the direction perpendicular to the step 10.

Polyimide is spin coated on the substrate surface to embed the grooves 14. The polyimide is etched back by a mixed gas of CF$_4$ and O$_2$ to expose the wiring layer 27. The polyimide is therefore embedded only in the grooves 14.

Figure 3A:
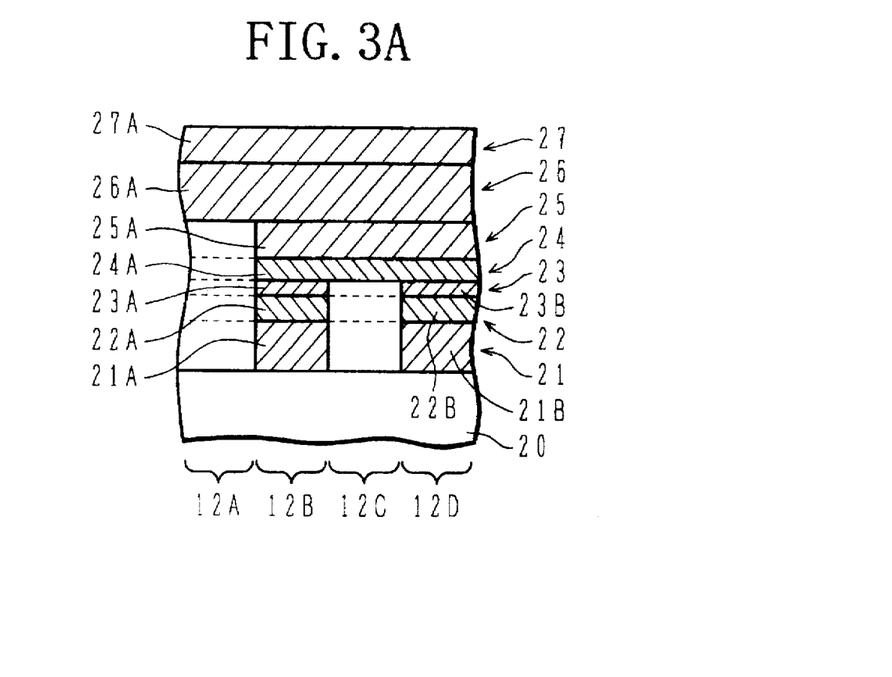
FIG. 3A is a cross sectional view of an ME-HBT manufactured by the semiconductor manufacture method of the first embodiment of the invention.

FIG. 3A is a cross sectional view of the substrate taken along one-dot-chain line A3—A3 of FIG. 2H. On the semi-insulating GaAs substrate 20, the word line layer 21, lower emitter layer 22, upper emitter layer 23, base layer 24, collector layer 25, sub-collector layer 26, and wiring layer 27 are sequentially deposited in this order.

In the sub-region 12A, the regions from the word line layer 21 to the collector layer 25 are high resistance regions, and in the sub-region 12C, the regions from the word line layer 21 to the upper emitter layer 23 are high resistance regions. In the sub-regions 12B and 12D, word lines 21A and 21B of the word line layer 21 extend in the direction perpendicular to the drawing sheet. Lower emitter regions 22A and 22B of the lower emitter layer 22 are disposed on the word lines 21A and 21B.

On the lower emitter regions 22A and 22B, upper emitter regions 23A and 23B of the upper emitter layer 23 are disposed respectively. Since the grooves 14 shown in FIG. 2H are formed from the upper emitter layer 23 to the wiring layer 27, elements are electrically separated in the direction perpendicular to the drawing sheet of FIG. 3A.

The upper emitter regions 23A and 23B are connected by a base region 24A of the base layer 24. On the base region 24A, a collector region 25A of the collector layer 25 is disposed. On the collector region 25A, a sub-collector region 26A of the sub-collector layer 26 and a wiring pattern 27A of the wiring layer 27 are disposed.

As shown in FIG. 3A, a multi-emitter type hereto bipolar transistor (ME-HBT) is formed at each cross point between a pair of word lines 21A and 21B extending in the direction perpendicular to the drawing sheet and the wiring pattern 27A extending in the lateral direction. These ME-HBTs are electrically separated by the high resistance AlGaAs semiconductor regions with lattice structures identical to those of underlying surfaces and semiconductor regions of ME-HBTs, in the lateral direction, and by the polyimide embedded in the grooves 14 shown in FIG. 2H, in the direction perpendicular to the drawing sheet.

The two lower emitter regions as well as the two upper emitter regions of each ME-HBT are electrically separated by the semiconductor regions with lattice structures identical to those of the underlying surface and emitter regions. The wiring patterns 21A and 21B of each ME-HBT are electrically separated by the high resistance stripe semiconductor regions with lattice structures identical to those of the underlying surface and the wiring patterns 21A and 21B. In the above way, a plurality of ME-HBTs with element separation are disposed in a matrix pattern.

As above, each monolayer is grown from the step by periodically changing the composition sequence of source material. Therefore, without performing photolithography and etching, a semiconductor region having a desired composition can be disposed in a desired region, the semiconductor region being able to epitaxially grow in one direction on the in-plane of the substrate. By periodically disposing a high resistance semiconductor region, element separation or wiring separation can be achieved in one direction.

Information of one bit can be stored by utilizing negative resistance caused by the tunneling effects of a p-n junction between the upper emitter regions 23A and 23B and the base region 24A of each ME-HBT. The principle of a memory function are detailed in U.S. Pat. No. 5,311,465 which is herein incorporated by reference.

Figure 3B:
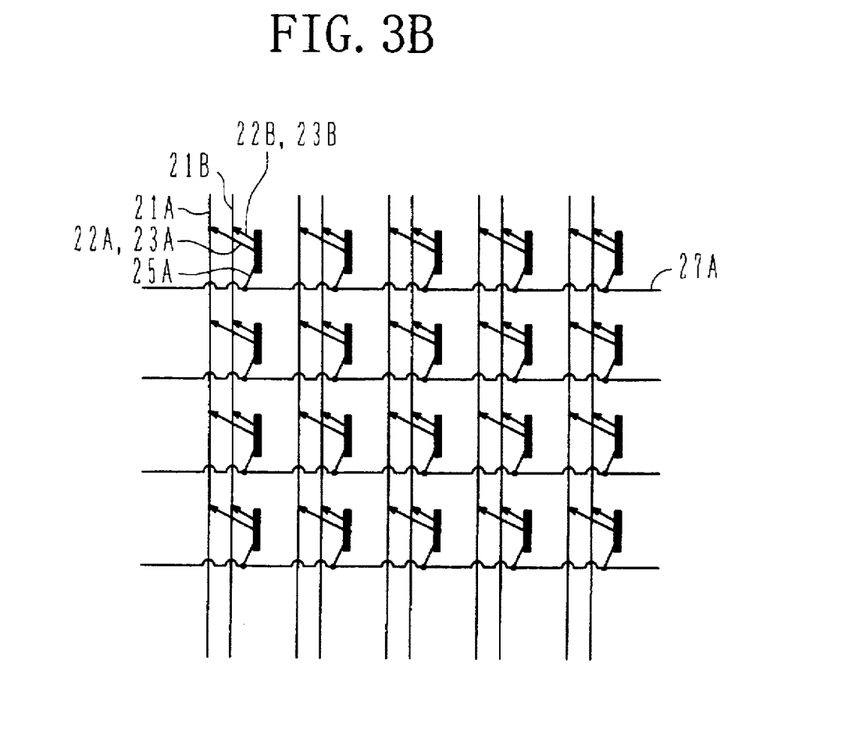
FIG. 3B is an equivalent circuit diagram of a matrix of ME-HBTs manufactured by the semiconductor manufacture method of the first embodiment of the invention.

FIG. 3B is an equivalent circuit diagram of an ME-HBT shown in FIG. 3A. A plurality pairs of word lines 21A and 21B extend in the vertical direction in FIG. 3B. A plurality of wiring patterns 27A extend in the horizontal direction in FIG. 3B.

Each ME-HBT is disposed at a cross point between a pair of word lines 21A and 21B and the wiring pattern 27A. The collector region 25A of each ME-HBT is connected to the corresponding wiring pattern 27A, the upper emitter region 23A is connected via the lower emitter region 22A to the word line 21A, and the upper emitter region 23B is connected via the lower emitter region 22B to the word line 21B. Since one ME-HBT can store information of one bit, a semiconductor memory device can be manufactured which can store information of one bit at each cross point between a pair of word lies 21A and 21B and the wiring pattern 27A.

Next, the principle of growth of a semiconductor layer according to the second embodiment of the invention will be described with reference to FIG. 4.

Figure 4:
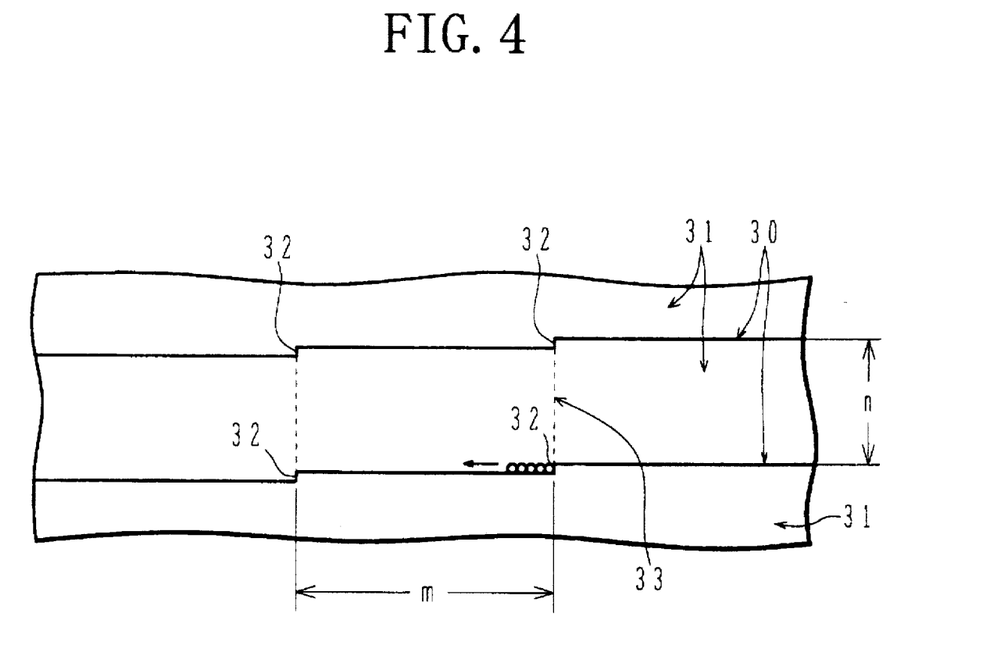
FIG. 4 is a plan view of a substrate illustrating the principle of the growth of a semiconductor layer according to a second embodiment of the invention.

FIG. 4 is a plan view of a GaAs semiconductor substrate having a small off-angle in the [1 1 0] direction from the (0 0 1) plane. A plurality of steps 30 extend in a lateral direction in FIG. 4. A terrace 31 with the (0 0 1) plane is defined between two adjacent steps 31. A plurality of kinks 32 are formed at each step 30 at generally an equal interval. The distance between two adjacent kinks is represented by a distance corresponding to m monolayers, and the distance between two adjacent steps is represented by a distance corresponding to n monolayers.

As semiconductor material capable of epitaxially growing is supplied to the semiconductor substrate, atoms of the source material couple with the kink 32. As the atoms couple with the kink 32, the kink 32 moves by a distance of a monolayer to the left as viewed in FIG. 4. As the source material continues to be supplied, the kink further moves by a distance of a monolayer. Moving the kink by the distance of m monolayers corresponds to moving the step by a distance of a monolayer as viewed in FIG. 4.

The growth process until the kink moves by the distance of m monolayers is defined as a subsidiary cycle. As the subsidiary cycle is repeated n times, a semiconductor layer of one monolayer can be deposited over the whole region of the underlying surface. The process of repeating the subsidiary cycle n times is defined as a main cycle. As the main cycle is performed a plurality of times, a semiconductor layer having a plurality of stacked monolayers can be formed. If the composition of the source material is changed during each subsidiary cycle while the composition change sequence of the source material is maintained constant, and if the subsidiary cycle is executed a plurality of times, then stripe monolayers can be formed changing their compositions in the direction parallel with the step 30.

If during one main cycle the composition change sequence of the source material is changed at each subsidiary cycle constituting one main cycle, a plurality of stripe monolayers having different composition change patterns can be formed. If the main cycle is repeated while the composition change sequence of the source material during each one main cycle is maintained constant, a semiconductor layer can be formed having the composition changing both in the directions parallel with and perpendicular to the step 30.

Next, a method of manufacturing a semiconductor device according to the second embodiment of the invention will be described with reference to FIGS. 5A to 5F. FIGS. 5A to 5F show patterns in plan view of semiconductor layers formed in the terrace region 33 of a rectangle having four kinks as its apexes. A GaAs substrate is used which has the plane slightly tilted from (0 0 1) plane by about 0.2° in the [1 1 0] direction. The distance between two adjacent steps 30 is about 80 nm (corresponding to a length of about 400 monolayers) and the distance between two adjacent kinks 32 is about 40 nm (corresponding to a length of about 200 monolayers). In this case, 400 subsidiary cycles constitute one main cycle.

Figure 5A:
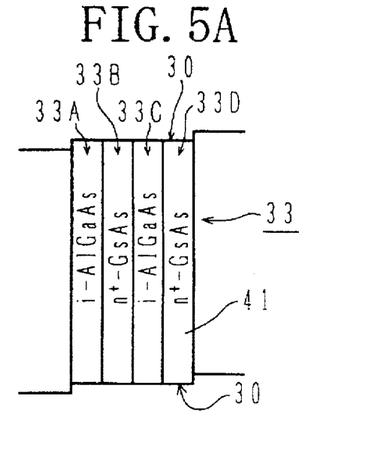
FIGS. 5A to 5F are plan views illustrating a method of manufacturing a semiconductor device according to the second embodiment of the invention.

The upper and lower sides of the terrace region 33 shown in FIG. 5A correspond to the steps 30 on the GaAs substrate surface. A semiconductor layer is deposited on the underlying surface, for example, by using a solid source material and MBE under the conditions of a substrate temperature of 690°, a V/III ratio of 6, and a growth speed of 0.001 μm/h. Under these conditions, one subsidiary cycle is about 2 seconds, and one main cycle is about 800 seconds. If the composition of the source material is changed during the subsidiary cycle, shutter opening and closing times are added to the above times.

During one subsidiary cycle, n$^+$-type GaAs, non-doped AlGaAs, n$^+$-type GaAs, and non-doped AlGaAs are sequentially deposited in this order. This subsidiary cycle is repeated 400 times to deposit a semiconductor layer of one monolayer over the whole region of the underlying surface. By repeating the main cycle 1061 times, a semiconductor layer of about 300 nm thick is formed.

The terrace region 33 is divided in the direction parallel with the step 30 to define four sub-regions 33A to 33D. On the leftmost sub-region 33A and third sub-region 33C from the leftmost, the non-doped AlGaAs monolayers are formed, and on the second sub-region 33B from the leftmost and the rightmost sub-region 33D, the n$^+$ type GaAs monolayers which constitute a word line layer 41 are formed.

In the processes illustrated in FIGS. 5B to 5F, semiconductor layers are sequentially formed by changing the composition change sequence of the source material and the number of repetitions of the main cycle, differently from those used at the process described with FIG. 5A.

Figure 5B:
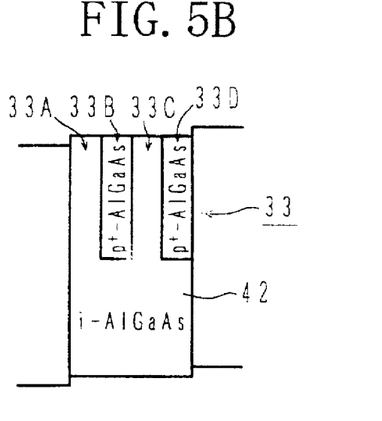

As shown in FIG. 5B, in the lower half region of the terrace region 33, a non-doped AlGaAs layer is deposited in the sub-regions 33A to 33D without changing the composition of the source material during each subsidiary cycle. In the upper half region, non-doped AlGaAs layers are deposited in the sub-regions 33A and 33C, and Be doped $p^+$-type AlGaAs layers having an impurity concentration of $1 \times 10^{19}$ $cm^{-3}$ are deposited in the sub-regions 33B and 33D. The thicknesses of these semiconductor layers are 50 nm. In this manner, a lower emitter layer 42 is formed which has the $p^+$-type AlGaAs layers disposed like islands in the high resistance non-doped AlGaAs layer.

Figure 5C:
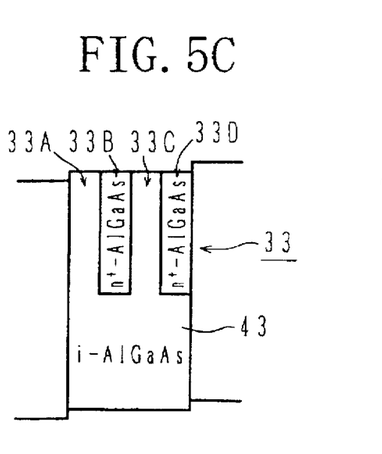

As shown in FIG. 5C, in the lower half region of the terrace region 33, a non-doped AlGaAs layer is deposited, and in the upper half region, non-doped AlGaAs layers are deposited in the sub-regions 33A and 33C, and Si doped $n^+$-type AlGaAs layers having an impurity concentration of $5 \times 10^{18}$ $cm^{-3}$ are deposited in the sub-regions 33B and 33D. The thicknesses of these semiconductor layers are 50 nm. In this manner, an upper emitter layer 43 is formed which has the $n^+$-type AlGaAs layers disposed like islands in the high resistance non-doped AlGaAs layer.

Figure 5D:
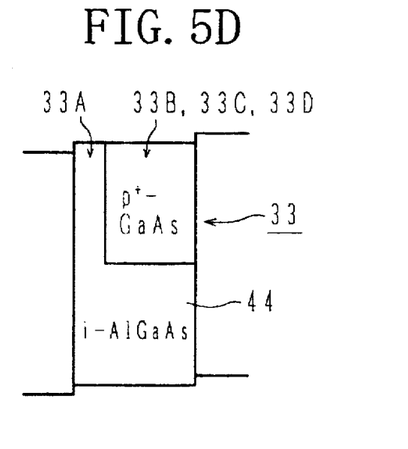

As shown in FIG. 5D, in the lower half region of the terrace region 33, a non-doped AlGaAs layer is deposited, and in the upper half region, a non-doped AlGaAs layer is deposited in the sub-region 33A, and Be doped $p^+$-type GaAs layers having an impurity concentration of $1 \times 10^{19}$ $cm^{-3}$ are deposited in the sub-regions 33B to 33D. The thicknesses of these semiconductor layers are 70 nm. In this manner, a base layer 44 is formed which has the $p^+$-type GaAs layer disposed like an island in the high resistance non-doped AlGaAs layer.

Figure 5E:
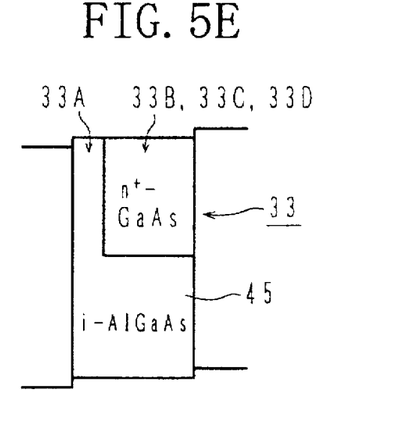

As shown in FIG. 5E, in the lower half region of the terrace region 33, a non-doped AlGaAs layer is deposited, and in the upper half region, a non-doped AlGaAs layer is deposited in the sub-region 33A, and Si doped n-type GaAs layers having an impurity concentration of $1 \times 10^{17}$ $cm^{-3}$ are deposited in the sub-regions 33B to 33D. The thicknesses of these semiconductor layers are 400 nm. In this manner, a collector layer 45 is formed which has the n-type GaAs layer disposed like an island in the high resistance non-doped AlGaAs layer.

Figure 5F:
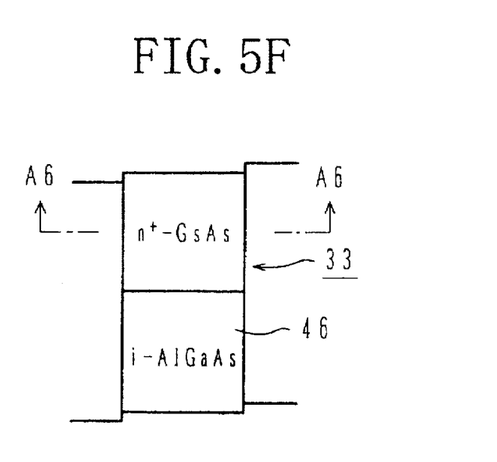

As shown in FIG. 5F, in the lower half region of the terrace region 33, a non-doped AlGaAs layer is deposited, and in the upper half region, a Si doped $n^+$-type GaAs layer having an impurity concentration of $5 \times 10^{18}$ $cm^{-3}$ is deposited. The thicknesses of these semiconductor layers are 400 nm. In this manner, a sub-collector layer 46 is formed which has the high resistance AlGaAs stripe regions and the $n^+$-type GaAs stripe regions alternately arranged in the direction parallel with the step 30.

Figure 6:
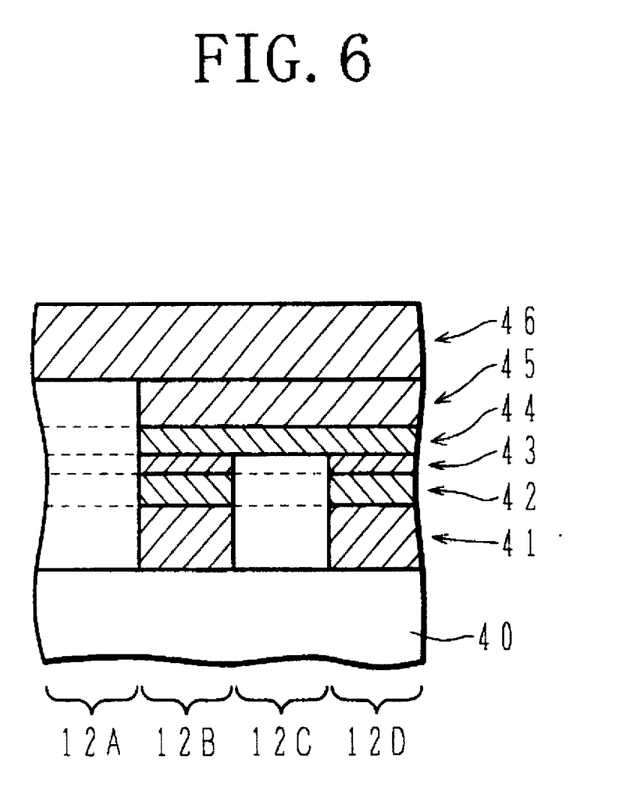
FIG. 6 is a cross sectional view of an ME-HBT manufactured by the semiconductor manufacture method of the second embodiment of the invention.
Figure 7A:
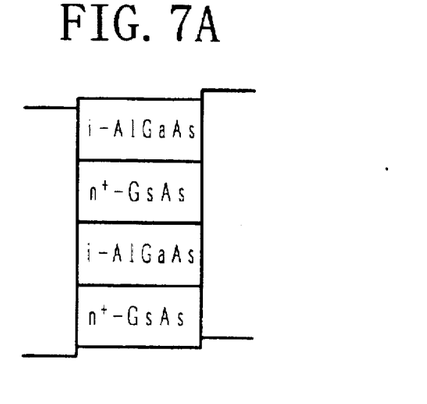
FIGS. 7A to 7F are plan views illustrating a method of manufacturing a semiconductor device according to a modification of the second embodiment of the invention.
Figure 7B:
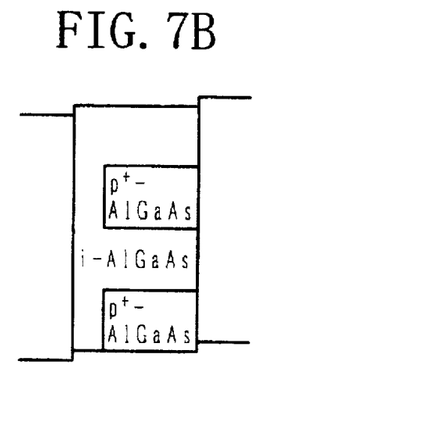
Figure 7C:
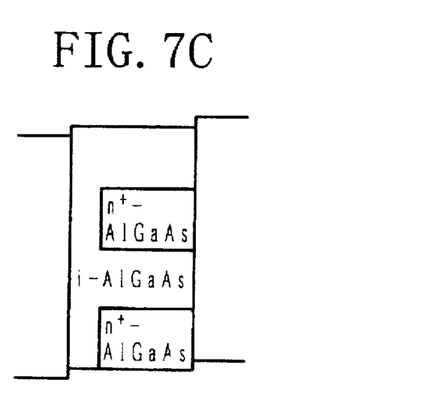
Figure 7D:
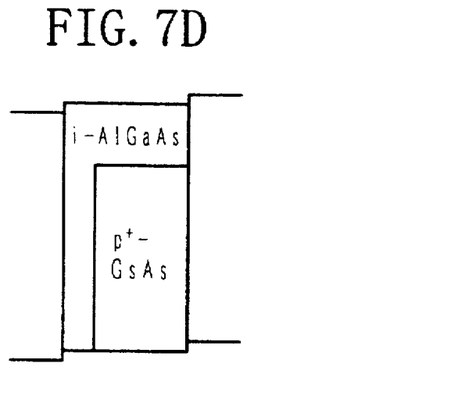
Figure 7E:
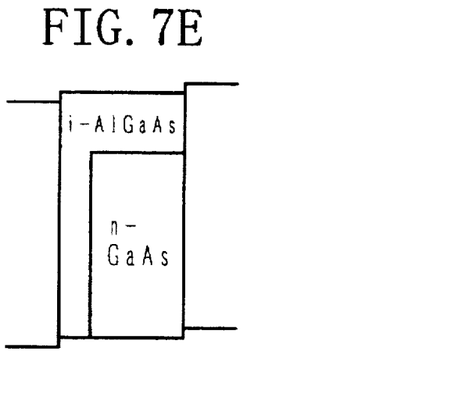
Figure 7F:
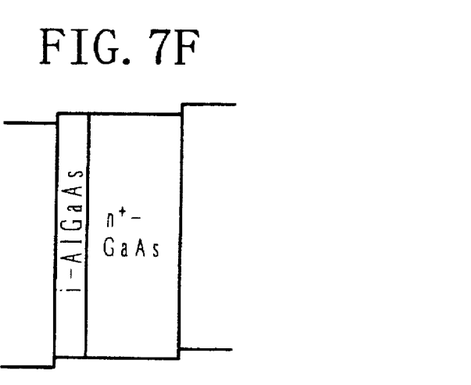

FIG. 6 is a cross sectional view of the substrate taken along one-dot-chain line A6—A6 of FIG. 5F. On the semi-insulating GaAs substrate 40, the word line layer 41, lower emitter layer 42, upper emitter layer 43, base layer 44, collector layer 45, and sub-collector layer 46 are sequentially deposited in this order. The configuration of each layer is the same as ME-FET shown in FIG. 3A. In FIG. 3A, the wiring layer 27 is formed on the sub-collector layer 26. In FIG. 6, the wiring layer 27 is not formed, but the sub-collector layer 45 is used as the wiring layer.

In FIG. 3A, polyimide achieves element separation in the direction perpendicular to the drawing sheet. In FIG. 6, the high resistance AlGaAs regions achieve element isolation both in the lateral direction and the direction perpendicular to the drawing sheet. As above, each semiconductor layer is grown by using kinks as the growth nuclei and periodically changing the composition sequence of source material. Therefore, without performing photolithography and etching, a semiconductor region having a desired composition can be disposed in a desired region in two directions on the in-plane of the substrate, the semiconductor region being able to epitaxially grow. By periodically disposing a high resistance semiconductor region in two directions, element separation or wiring separation can be achieved.

FIGS. 7A to 7F illustrate a method of manufacturing a semiconductor device according to a modification of the second embodiment of the invention. In the second embodiment, the word lines of the $n^+$-type GaAs stripe regions extend in the direction intersecting with the step 30 as shown in FIG. 5A, and the bit line of the $n^+$-type GaAs stripe region extends in the direction parallel with the step 30. Conversely, in this modification shown in FIGS. 7A to 7F, the word lines extend in the direction parallel with the step, and the bit line extends in the direction intersecting with the step.

FIGS. 7A to 7F are plan views respectively corresponding to FIGS. 5A to 5F of the second embodiment. The layout of semiconductor regions in each layer shown in FIGS. 7A to 7F is similar to the pattern of the semiconductor regions of each layer shown in FIGS. 5A to 5F rotated by about 90 degrees on the in-plane of the substrate respectively. Also in the modification shown in FIGS. 7A to 7F, an ME-HBT can be formed at each cross point between the word lines and bit line without using photolithography and etching.

In the first and second embodiments, word and bit lines are disposed in the directions intersecting with each other, and a semiconductor memory device having ME-HBTs at cross points is manufactured. Other semiconductors may also be manufactured by the method similar to the embodiment methods.

Further, in the above embodiments, although GaAs and AlGaAs are deposited on a GaAs substrate, other semiconductor materials may be used if they have a property of growing a monolayer using one point of a step or a kink as a growth nucleus.

The present invention has been described in connection with the preferred embodiments. The invention is not limited only to the above embodiments. It is apparent to those skilled in the art that various modifications, improvements, combinations and the like can be made without departing from the scope of the appended claims.

We claim:

1. A method of manufacturing a semiconductor device comprising the steps of:

forming a substrate having an off-angle and a semiconductor surface with a plurality of steps each having a height of one monolayer and extending in the same direction; and laminating a plurality of composition changing layers each having a different composition changing pattern, by repeating, a process of depositing a semiconductor layer of one monolayer while semiconductor source material is supplied to the semiconductor surface of said substrate and while a composition of the semiconductor source material is changed during a period from a start of deposition of the semiconductor layer to the end of deposition of the semiconductor layer of one monolayer, a plurality of times while a composition change sequence of the source material is maintained constant, to thereby form each said composition changing layer, and by forming said plurality of composition changing layers by changing a composition change sequence of the source material for each said composition changing layer.

2. A method of manufacturing a semiconductor device comprising the steps of:

forming a substrate having an off-angle and a semiconductor surface with a plurality of steps each having a height of one monolayer and extending in the same direction;

forming a word line layer by depositing a first monolayer on the semiconductor surface of said substrate and laminating monolayers having a same pattern as the first monolayer, said first monolayer having high resistance stripe regions and conductive stripe regions extending in said same direction and alternately arranged in a direction intersecting with said same direction by a right angle;

forming a lower emitter layer on said word line layer by depositing a second monolayer on said word line layer and laminating monolayers having a same pattern as the second monolayer, said second monolayer having a high resistance region on each said high resistance stripe region of said word line layer and a semiconductor region of a first conductivity type on each said conductive stripe region of said word line layer;

forming an upper emitter layer on said lower emitter layer by depositing a third monolayer on said lower emitter layer and laminating monolayers having a same pattern as the third monolayer, said third monolayer having a high resistance region on said high resistance region of said lower emitter layer and a semiconductor region of a second conductivity type opposite to the first conductivity type on the semiconductor region of the first conductivity type of said lower emitter layer;

forming a base layer on said upper emitter layer by depositing a fourth monolayer on said upper emitter layer and laminating monolayers having a same pattern as the fourth monolayer, said fourth monolayer having a high resistance region on said every other high resistance region of said upper emitter layer and a semiconductor region of the first conductivity type on the other region of said upper emitter layer;

forming a collector layer on said base layer by depositing a fifth monolayer on said base layer and a laminating monolayers having a same pattern as the fifth monolayer, said fifth monolayer having a high resistance region on said high resistance region of said base layer and a semiconductor region of the second conductivity type on said semiconductor region of the first conductivity type of said base layer; and forming a conductive layer on a whole surface of said collector layer for ohmic contacting to said collector layer.

3. A method according to claim 2, further comprising the step of forming a plurality of grooves extending in a direction intersecting with said same direction and reaching from an upper surface of said conductive layer to a lower surface of said upper emitter layer.

4. A method of manufacturing a semiconductor device comprising the steps of:

forming a substrate having an off-angle and a semiconductor surface with a plurality of steps each having a height of one monolayer and extending in a first direction and with a plurality of kinks formed at cross points between each said step and a plurality of virtual straight lines extending in a second direction intersecting with said first direction;

supplying semiconductor source material to the semiconductor surface of said substrate and depositing atoms of the semiconductor source material along the each step from each kink to a next kink, a train of the atoms being deposited by changing the composition of the semiconductor source material at least once during the deposition; and repeating said atom train depositing step by a plurality of times while a composition change sequence of the source material is maintained constant to thereby form a monolayer stripe region extending in said first direction and changing the composition in said first direction.

5. A method according to claim 4, further comprising the steps of:

repeating said monolayer stripe region forming step a plurality of times while a composition change sequence of the source material is changed to thereby deposit a monolayer semiconductor layer on a whole surface; and repeating said monolayer semiconductor layer depositing step a plurality of times while a composition change sequence of the source material is set to a same sequence as that used when an underlying monolayer semiconductor layer is deposited, to thereby form a composition changing layer changing a composition in a substrate in-plane.

6. A method according to claim 5, further comprising the step of laminating a plurality of composition changing layers each having a different composition changing pattern with respect to the surface of the substrate, by changing the composition change sequence of the source material for each said composition changing layer.

7. A method of manufacturing a semiconductor device comprising the steps of:

forming a substrate having an off-angle and a semiconductor surface with a plurality of steps each having a height of one monolayer and extending in a first direction and with a plurality of kinks formed at cross points between each said step and a plurality of virtual straight lines extending in a second direction intersecting with said first direction;

forming a word line layer by depositing a first monolayer and laminating monolayers having the same pattern as the first monolayer, when defining rectangular regions of said substrate surface, each of the rectangular regions having at least one kink as an apex, each of said rectangular regions being defined by a pair of sides parallel with one of said first and second directions and a pair of sides parallel with the other of said first and second directions, each of said rectangular regions being divided into four regions in one of said first direction and said second direction and into two regions in said other of said first direction and said second direction, and four regions of one of two sets of four regions disposed in one of said first direction and said second direction being represented by first, second, third, and fourth regions and four regions of the other of two sets of four regions by fifth, sixth, seventh, and eighth regions corresponding to said first, second, third, and fourth regions, the first monolayer having high resistance regions at said first, third, fifth, and seventh regions and conductive regions at said second, fourth, sixth, and eighth regions;

forming a lower emitter layer by depositing a second monolayer and laminating monolayers having a same pattern as the second monolayer, the second monolayer having semiconductor regions of a first conductivity type at said second and fourth regions and high resistance regions at said first, third, and fifth to eighth regions;

forming an upper emitter layer by depositing a third monolayer and laminating monolayers having a same pattern as the third monolayer, the third monolayer having semiconductor regions of a second conductivity type opposite to the first conductivity type at said second and fourth regions and high resistance regions at said first, third, and fifth to eighth regions;

forming a base layer by depositing a fourth monolayer and laminating monolayers having a same pattern as the fourth monolayer, the fourth monolayer having semiconductor regions of the first conductivity type at said second to fourth regions and high resistance regions at said first region and said fifth to eighth regions;

forming a collector layer by depositing a fifth monolayer and laminating monolayers having a same pattern as the fifth monolayer, the fifth monolayer having semiconductor regions of the second conductivity type at said second to fourth regions and high resistance regions at said first region and said fifth to eighth regions; and forming a bit line layer by depositing a sixth monolayer and laminating monolayers having a same pattern as the sixth monolayer, the sixth monolayer having semiconductor regions of the second conductivity type at said first to fourth regions and high resistance regions at said fifth to eighth regions.

8. A method of manufacturing a semiconductor device comprising the steps of:

forming a substrate having an off-angle and a semiconductor surface with a plurality of steps each having a height of one monolayer and extending in a first direction and with a plurality of kinks formed at cross points between each said step and a plurality of virtual straight lines extending in a second direction intersecting with said first direction;

forming a bit line layer by depositing a first monolayer and laminating monolayers having a same pattern as the first monolayer, when defining rectangular regions of said substrate surface, each of the rectangular regions having at least one kink as an apex, each of said rectangular regions being defined by a pair of sides parallel with one of said first and second directions and a pair of sides parallel with the other of said first and second directions, each of said rectangular regions being divided into four regions in one of said first direction and said second direction and into two regions in the other of said first direction and said second direction, and four regions of one of two sets of four regions disposed in said one of said first direction and said second direction being represented by first, second, third, and fourth regions and four regions of the other of two sets of four regions by fifth, sixth, seventh, and eighth regions corresponding to said first, second, third, and fourth regions, the first monolayer having semiconductor regions of a first conductivity type at said first to fourth regions and high resistance regions at said fifth to eighth regions;

forming a collector layer by depositing a second monolayer and laminating monolayers having a same pattern as the second monolayer, the second monolayer having semiconductor regions of the first conductivity type at said second to fourth regions and high resistance regions at said first region and said fifth to eight regions;

forming a base layer by depositing a third monolayer and laminating monolayers having a same pattern as the third monolayer, the third monolayer having semiconductor regions of a second conductivity type opposite to the first conductivity type at said second to fourth regions and high resistance regions at said first region and said fifth to eighth regions;

forming a lower emitter layer by depositing a fourth monolayer and laminating monolayers having a same pattern as the fourth monolayer, the fourth monolayer having semiconductor regions of the first conductivity type at said second and fourth regions and high resistance regions at said first, third, and fifth to eighth regions;

forming an upper emitter layer by depositing a fifth monolayer and laminating monolayers having a same pattern as the fifth monolayer, the fifth monolayer having semiconductor regions of the second conductivity type at said second and fourth regions and high resistance regions at said first, third, and fifth to eight regions; and forming a word line layer by depositing a sixth monolayer and laminating monolayers having a same pattern as the sixth monolayer, the sixth monolayer having high resistance regions at said first, third, fifth, and seventh regions and conductivity regions at said second, fourth, sixth, and eighth regions.

* * * * *